United States Patent
Chanda et al.

(10) Patent No.: US 8,056,039 B2
(45) Date of Patent: Nov. 8, 2011

(54) INTERCONNECT STRUCTURE FOR INTEGRATED CIRCUITS HAVING IMPROVED ELECTROMIGRATION CHARACTERISTICS

(75) Inventors: Kaushik Chanda, Fishkill, NY (US); Ronald Filippi, Wappingers Falls, NY (US); Stephan Grunow, Poughkeepsie, NY (US); Chao-Kun Hu, Somers, NY (US); Sujatha Sankaran, New Paltz, NY (US); Andrew H. Simon, Fishkill, NY (US); Theodorus E. Standaert, Pine Bush, NY (US)

(73) Assignee: International Business Machines Corporation, Armonk, NY (US)

( * ) Notice: Subject to any disclaimer, the term of this patent is extended or adjusted under 35 U.S.C. 154(b) by 758 days.

(21) Appl. No.: 12/128,973

(22) Filed: May 29, 2008

(65) Prior Publication Data

US 2009/0294973 A1   Dec. 3, 2009

(51) Int. Cl.
*G06F 17/50* (2006.01)

(52) U.S. Cl. ............ 716/115; 716/54; 716/55; 716/112; 716/126; 257/767; 438/618

(58) Field of Classification Search .............. 716/50–56, 716/112, 115, 126; 257/767; 438/618
See application file for complete search history.

(56) References Cited

U.S. PATENT DOCUMENTS

| | | | |
|---|---|---|---|
| 5,382,831 A | 1/1995 | Atakov et al. | |
| 5,439,731 A | 8/1995 | Li et al. | |
| 5,472,911 A | 12/1995 | Dreyer et al. | |
| 5,689,139 A | 11/1997 | Bui et al. | |
| 5,712,510 A * | 1/1998 | Bui et al. | 257/758 |
| 6,191,481 B1 | 2/2001 | Bothra et al. | |
| 6,271,574 B1 * | 8/2001 | Delpech et al. | 257/529 |
| 6,417,572 B1 | 7/2002 | Chidambarrao et al. | |
| 6,725,433 B1 * | 4/2004 | Hau-Riege et al. | 324/762.01 |
| 6,822,437 B1 | 11/2004 | Hau-Riege et al. | |
| 6,822,473 B1 * | 11/2004 | Hau-Riege et al. | 324/762.1 |
| 7,062,850 B2 | 6/2006 | Atakov et al. | |
| 2007/0069331 A1 * | 3/2007 | Maiz et al. | 257/529 |
| 2007/0138511 A1 * | 6/2007 | Oates et al. | 257/208 |

OTHER PUBLICATIONS

I. A. Blech; "Electromigration in thin aluminum films on titanium nitride," Journal of Applied Physics, vol. 47, No. 4, Apr. 1976; pp. 1203-1208.
B. J. Root et al.; "Wafer Level Electromigration Tests for Production Monitoring;" IEEE/IRPS 1985; pp. 100-107.
PCT/ISA/220 Notification of Transmittal of the International Search Report and the Written Opinion of the International Searching Authority, or the Declaration, International Appl. No. PCT/US 09/44948 filed May 22, 2009.

* cited by examiner

*Primary Examiner* — Thuan Do
*Assistant Examiner* — Nha Nguyen
(74) *Attorney, Agent, or Firm* — Cantor Colburn LLP; Katherine Brown

(57) ABSTRACT

An interconnect structure for an integrated circuit (IC) device includes an elongated, electrically conductive line comprising one or more segments formed at a first width, $w_1$, and one or more segments formed at one or more additional widths, $w_2 \ldots w_N$, with the first width being narrower than each of the one or more additional widths; wherein the relationship of the total length, $L_1$, of the one or more conductive segments formed at the first width to the total lengths, $L_2 \ldots L_N$, of the one or more conductive segments formed at the one or more additional widths is selected such that, for a given magnitude of current carried by the conductive line, a critical length with respect to an electromigration short-length effect benefit is maintained such that a total length of the conductive line, $L=L_1+L_2+ \ldots +L_N$, meets a minimum desired design length regardless of the critical length.

17 Claims, 12 Drawing Sheets

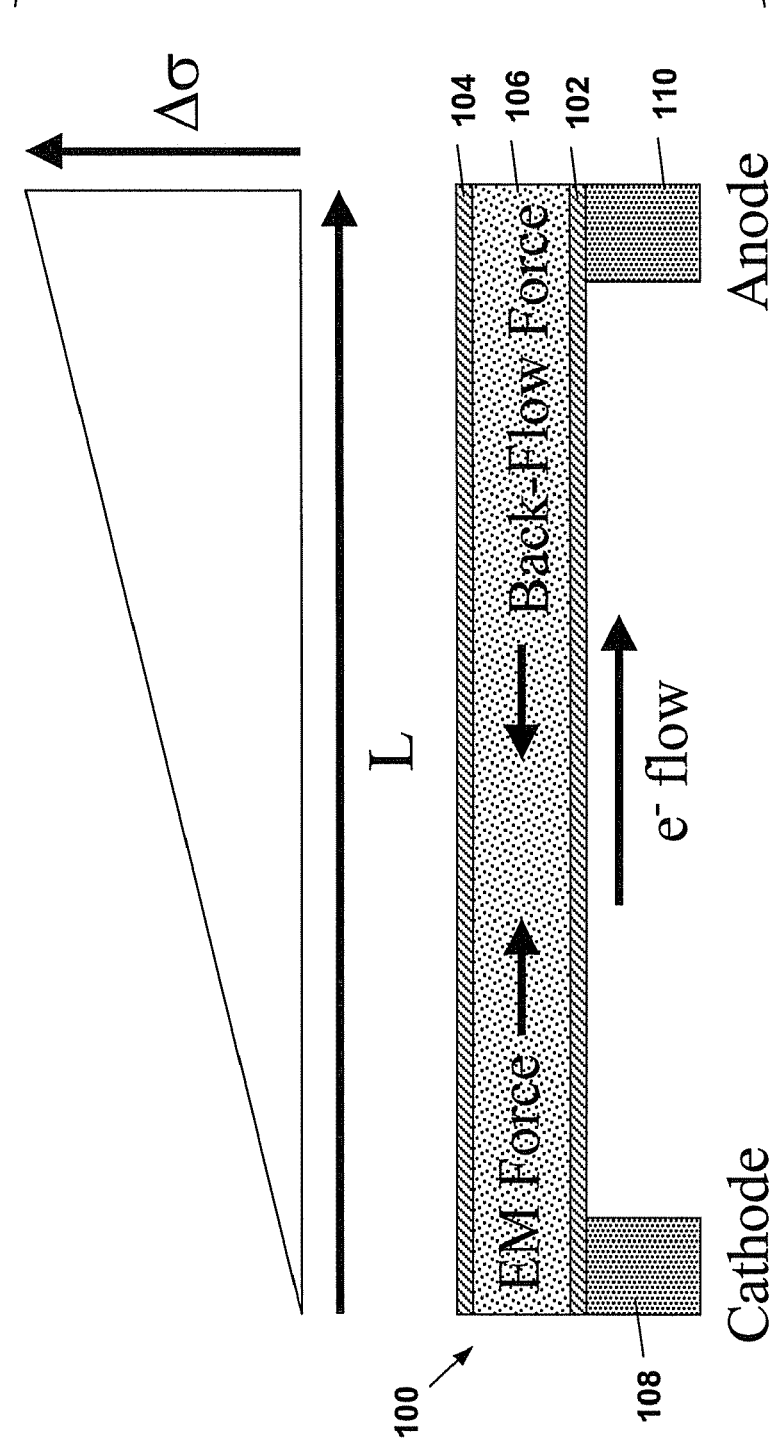

INTERCONNECT STRUCTURE FOR INTEGRATED CIRCUITS HAVING IMPROVED ELECTROMIGRATION CHARACTERISTICS

BACKGROUND

The present invention relates generally to integrated circuit (IC) device fabrication and, more particularly, to an interconnect structure for ICs having improved electromigration resistance characteristics.

Integrated circuits are typically fabricated with multiple levels of patterned metallization lines, electrically separated from one another by interlayer dielectrics containing vias at selected locations to provide electrical connections between levels of the patterned metallization lines. As these integrated circuits are scaled to smaller dimensions in a continual effort to provide increased density and performance (e.g., by increasing device speed and providing greater circuit functionality within a given area chip), the interconnect linewidth dimension becomes increasingly narrow, which in turn renders them more susceptible to deleterious effects such as electromigration.

Electromigration is a term referring to the phenomenon of mass transport of metallic atoms (e.g., copper or aluminum) which make up the interconnect material, as a result of unidirectional or DC electrical current conduction therethrough. More specifically, the electron current collides with the diffusing metal atoms, thereby pushing them in the direction of current travel. Over an extended period of time, the accumulation of metal at the anode end of the interconnect material significantly increases the local mechanical stress in the system. This in turn may lead to delamination, cracking, and even metal extrusion from the metal wire, thereby causing an electrical short to adjacent interconnects. Electromigration becomes increasingly more significant in integrated circuit design, as relative current densities through metallization lines continue to increase as the linewidth dimensions shrink.

SUMMARY

The foregoing discussed drawbacks and deficiencies of the prior art are overcome or alleviated, in an exemplary embodiment, by an interconnect structure for an integrated circuit (IC) device including an elongated, electrically conductive line comprising one or more segments formed at a first width, $w_1$, and one or more segments formed at one or more additional widths, $w_2 \ldots w_N$, with the first width being narrower than each of the one or more additional widths; wherein the relationship of the total length, $L_1$, of the one or more conductive segments formed at the first width to the total lengths, $L_2 \ldots L_N$, of the one or more conductive segments formed at the one or more additional widths is selected such that, for a given magnitude of current carried by the conductive line, a critical length with respect to an electromigration short-length effect benefit is maintained such that a total length of the conductive line, $L=L_1+L_2+ \ldots +L_N$, meets a minimum desired design length regardless of the critical length.

In another embodiment, an interconnect structure for an integrated circuit (IC) device includes an elongated, electrically conductive line comprising one or more layers of a refractory metal and nitrides thereof, and at least one of a copper containing material and an aluminum containing material, the electrically conductive line in electrical contact with a pair of diffusion barriers located at opposite ends of the conductive line; the elongated conductive line further comprising one or more segments formed at a first width, $w_1$, and one or more segments formed at one or more additional widths, $w_2 \ldots w_N$, with the first width being narrower than each of the one or more additional widths; wherein the relationship of the total length, $L_1$, of the one or more conductive segments formed at the first width to the total lengths, $L_2 \ldots L_N$, of the one or more conductive segments formed at the one or more additional widths is selected such that, for a given magnitude of current carried by the conductive line, a critical length with respect to an electromigration short-length effect benefit is maintained such that a total length of the conductive line, $L=L_1+L_2+ \ldots +L_N$, meets a minimum desired design length regardless of the critical length.

In still another embodiment a method of forming an interconnect structure for an integrated circuit (IC) device includes forming an elongated, electrically conductive line comprising one or more layers of a refractory metal and nitrides thereof, and at least one of a copper containing material and an aluminum containing material, the electrically conductive line in electrical contact with a pair of diffusion barriers located at opposite ends of the conductive line; the elongated conductive line further comprising one or more segments formed at a first width, $w_1$, and one or more segments formed at one or more additional widths, $w_2 \ldots w_N$, with the first width being narrower than each of the one or more additional widths; wherein the relationship of the total length, $L_1$, of the one or more conductive segments formed at the first width to the total lengths, $L_2 \ldots L_N$, of the one or more conductive segments formed at the one or more additional widths is selected such that, for a given magnitude of current carried by the conductive line, a critical length with respect to an electromigration short-length effect benefit is maintained such that a total length of the conductive line, $L=L_1+L_2+ \ldots +L_N$, meets a minimum desired design length regardless of the critical length.

BRIEF DESCRIPTION OF THE DRAWINGS

Referring to the exemplary drawings wherein like elements are numbered alike in the several Figures:

FIG. 1(b) is another schematic diagram illustrating both electromigration force and a stress-induced back flow of atoms when diffusion barriers are located at both cathode and anode ends of an interconnect structure;

DETAILED DESCRIPTION

Figure 1A:
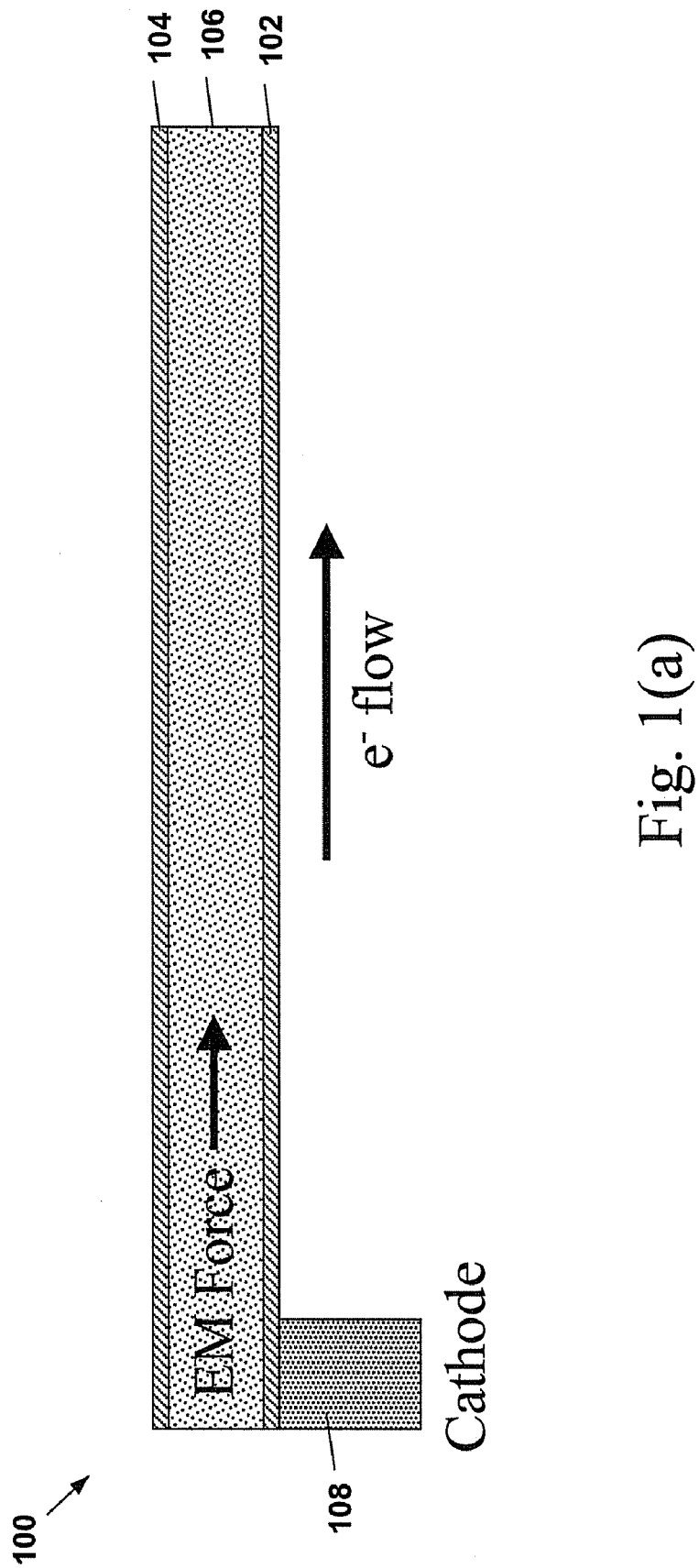
FIG. 1(a) is a schematic diagram illustrating the direction of electromigration force and electron flow away from the cathode end of IC interconnect structure, leading to migration of atoms from the cathode end.

As indicated above, electromigration (EM) is a reliability failure mechanism for metal interconnects in which metal atoms migrate under the influence of the electric field and electron flow. For the case of aluminum (Al) and copper (Cu) interconnects, the electromigration mass flow is in the direction of electron flow. During electromigration, the electron wind applies a force that results in an atomic flux, J, given by the following equation:

$$J = nv_e = n\left(\frac{D}{kT}\right)j\rho eZ^* \qquad \text{(Eq. 1)}$$

where n is the density of atoms, $v_e$ is the drift velocity of migrating atoms, D is the effective diffusivity, k is Boltzmann's constant, T is the absolute temperature, j is the current density, $\rho$ is the resistivity and $eZ^*$ is the effective ion charge. FIG. 1(a) illustrates a situation where the EM force is in the same direction as the electron flow for a multilayer aluminum copper (AlCu) interconnect structure 100 including lower refractory layer 102 (e.g., titanium (Ti), titanium nitride (TiN), tungsten (W)), AlCu layer 106, upper refractory layer 104, and a W stud 108 located at the cathode end of the line. The migration of atoms from the cathode end leads to void formation in this region, which eventually causes a resistance increase in the line.

However, in the presence of a diffusion barrier, atoms accumulate at the anode end and deplete the cathode end of the conductor, leading to a stress gradient and back diffusion of atoms (see, for example, I. A. Blech, J. Appl. Phys. 47, 1203 (1976)). The combination of electromigration and the stress-induced back flow of atoms gives rise to a net atomic flux, $J_{eff}$, given by the following equation at steady state:

$$J_{eff} = n(v_e - v_b) = \frac{nD}{kT}\left(j\rho eZ^* - \frac{\Delta\sigma\Omega}{L}\right) \qquad \text{(Eq. 2)}$$

where $v_b$ is the back flow velocity of atoms, $\Delta\sigma$ is the difference in stress between the cathode and the anode ends, $\Omega$ is the atomic volume and L is the conductor length. As illustrated in FIG. 1(b), a linear stress gradient develops after a certain period of time under steady state conditions. It is thus necessary to have a diffusion blocking material, such as W, located at both ends of the line in order for the stress to develop in those regions. In particular, FIG. 1(b) illustrates another tungsten stud 110 located at the anode end of the interconnect structure 100.

When the back stress gradient balances the electromigration force, mass transport is completely suppressed. This phenomenon is referred to as the electromigration threshold or the short-length effect, and occurs for sufficiently short interconnects and low current densities. The threshold condition is defined from the above relation for $J_{eff}$ such that:

$$(jL)_{th} = \frac{\Delta\sigma\Omega}{\rho eZ^*} \qquad \text{(Eq. 3)}$$

where $(jL)_{th}$ is referred to as the threshold length product. For jL values less than $(jL)_{th}$, there is no electromigration failure in the interconnect structure. If j and L correspond exactly to the threshold condition, then the length of the interconnect corresponds to what is referred to as the critical length. The short-length effect has been observed in AlCu interconnects with W interlevel studs, as well as in Dual Damascene Cu interconnects with interlevel vias, wherein the Dual Damascene interconnects utilize liner materials such as tantalum (Ta), tantalum nitride (TaN), Ti, TiN, W, ruthenium (Ru), ruthenium nitride (RuN), and tungsten nitride (WN), for example as diffusion barriers.

Figure 2A:
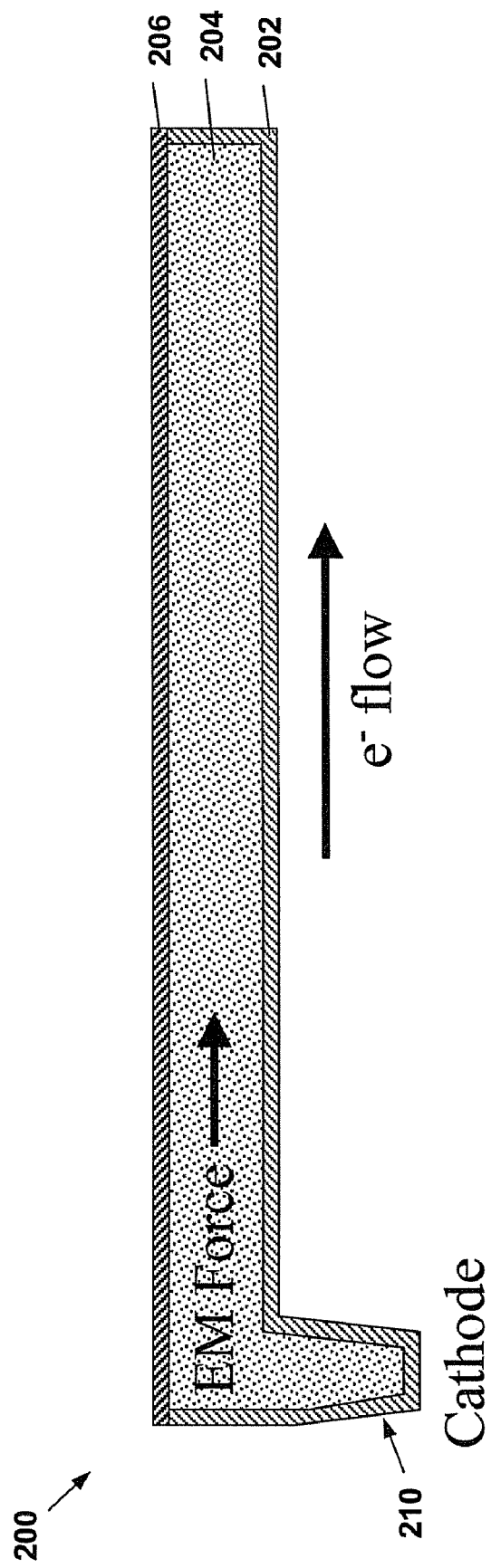
FIGS. 2(a) and 2(b) are Dual Damascene copper versions of the examples shown in FIGS. 1(a) and 1(b), respectively.
Figure 2B:
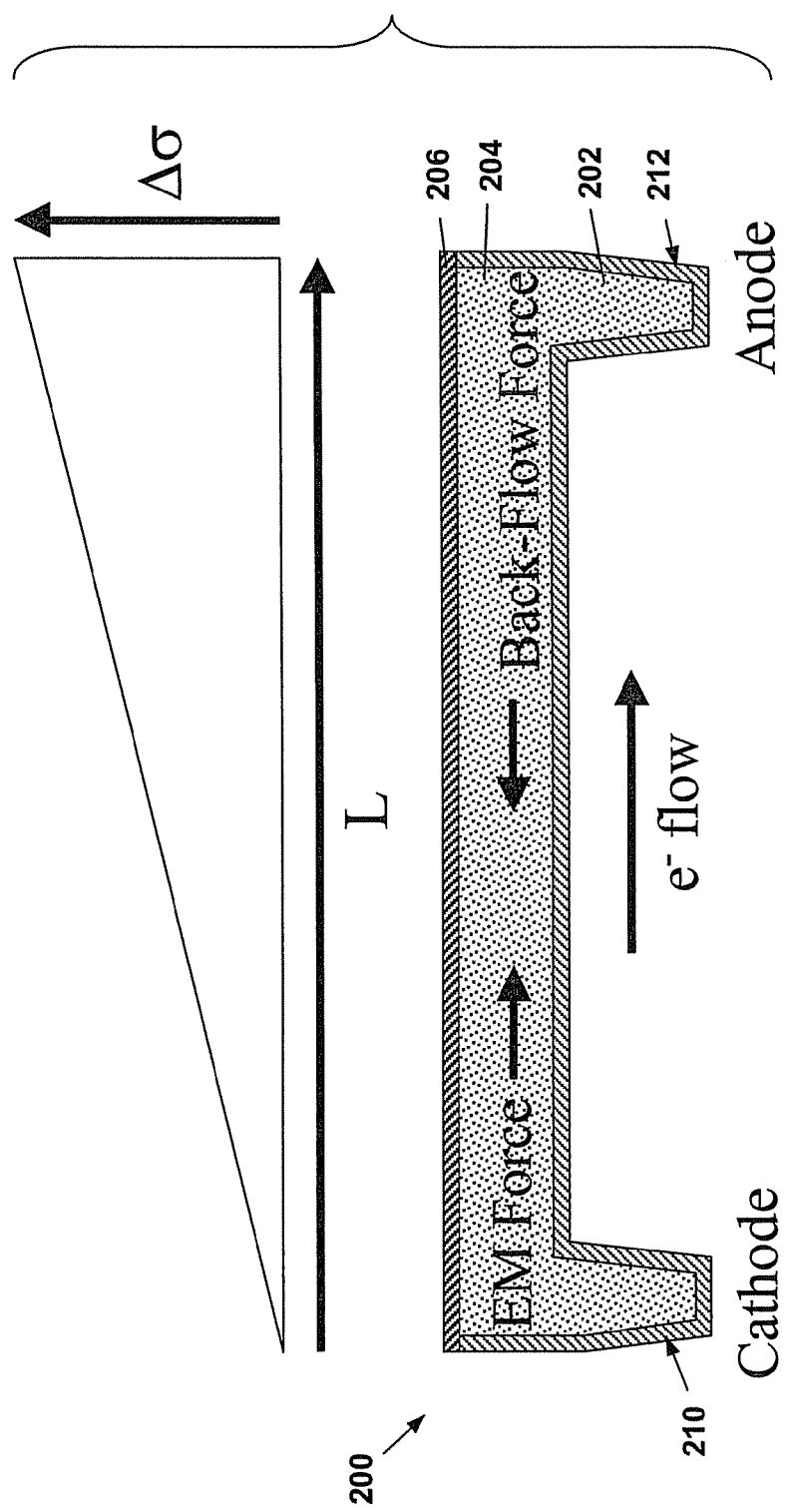

FIGS. 2(a) and 2(b) are Dual Damascene Cu versions of the examples shown in FIGS. 1(a) and 1(b), respectively. More specifically, FIG. 2(a) illustrates interconnect structure 200 including liner layer 202 (for preventing Cu diffusion), Dual Damascene Cu via/trench fill layer 204, and cap layer 206, with a filled via 210 located at the cathode end of the line. Exemplary cap layer materials may include, for example, dielectric materials such as silicon nitride ($Si_3N_4$), silicon carbide (SiC) or silicon carbide nitride (SiCN). Alternatively, metal cap materials such as Ta, TaN, cobalt tungsten phosphide (CoWP) or Ru may also be used, depending upon the technology. In FIG. 2(b), a blocking material, such as the liner material 202 is included within another filled via 212 located at the anode end of the interconnect structure 200.

Regardless of the specific type of via and interconnect metal(s) used, one way to take advantage of the short-length effect is to simply design short interconnects since the allowed current density increases as the conductor length decreases. However, this approach has limitations since the design of "short" interconnects (by definition) requires more interlevel vias, which in turn may cause yield degradation as well as increases in resistance. Therefore, it would be beneficial to design a layout that can tolerate higher current densities without significantly reducing the conductor length.

Figure 3A:
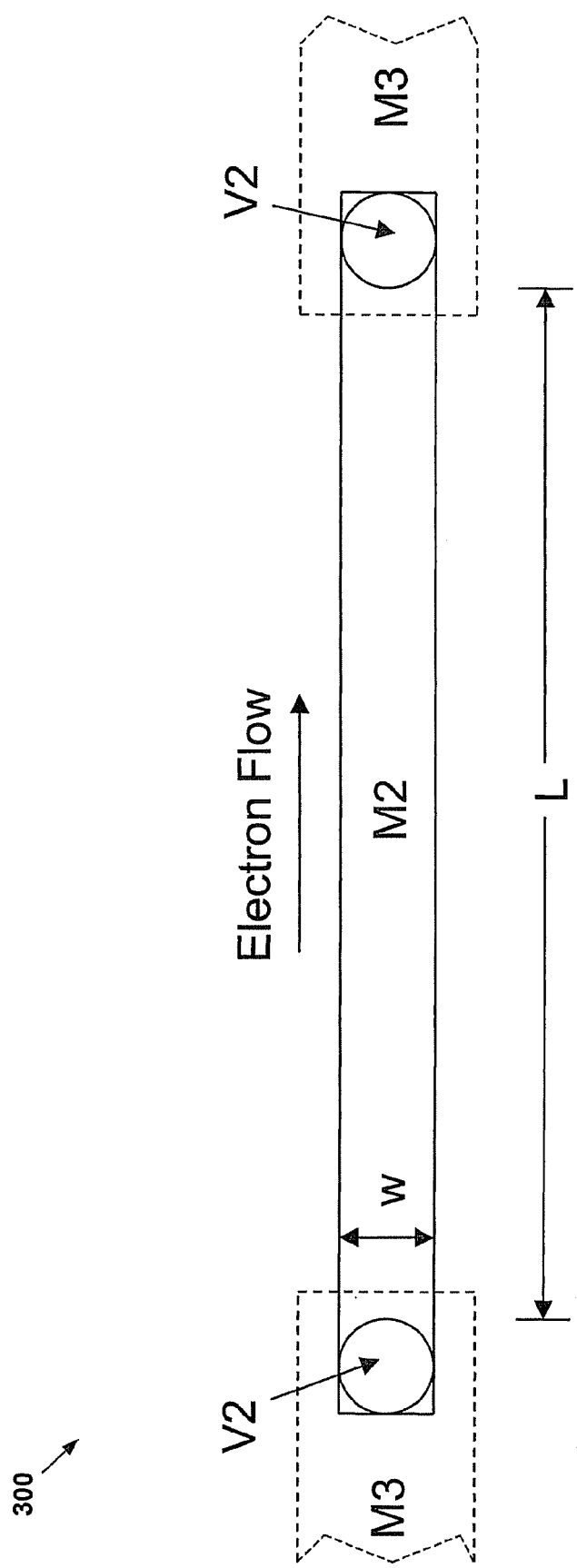
FIGS. 3(a) and 3(b) are top and cross-sectional views, respectively, of an M2 level interconnect of width w and length L, including V2 vias at the cathode and anode ends thereof.
Figure 3B:
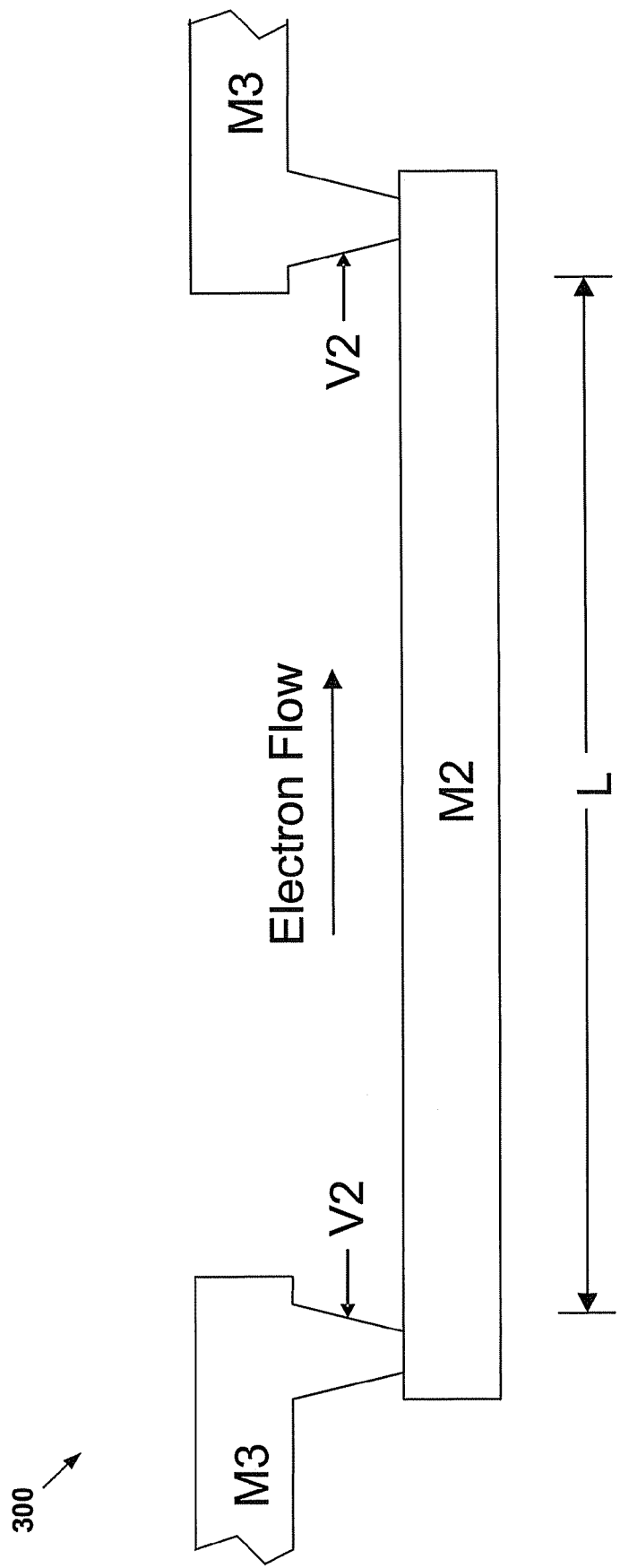

Referring now to FIGS. 3(a) and 3(b), there is shown an example of an M2 level interconnect 300 of width w and length L, and further including V2 vias at the cathode and anode ends thereof. In particular, FIG. 3(a) illustrates the top view while FIG. 3(b) illustrates a cross-sectional view of the interconnect. If this interconnect length, L, (the distance between the two V2 vias) is greater than the critical length, then no short-length benefits are derived and the structure is subject to the deleterious effects of electromigration over time. On the other hand, the distance between the vias could be reduced at or below the critical length in order to obtain short-length benefits. However, reducing the conductor length may not be a practical solution.

Figure 4:
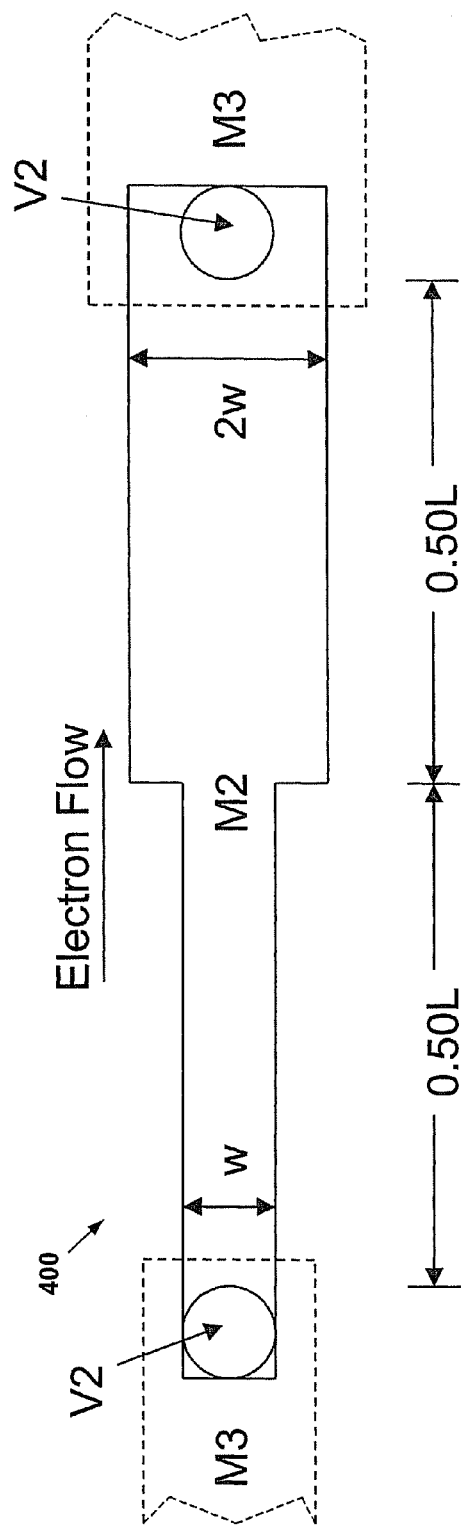
FIG. 4 is a schematic diagram of an interconnect structure having improved electromigration resistance characteristics, in accordance with an embodiment of the invention.

Accordingly, in the present embodiments, a different approach is taken, wherein for at least a portion of the total conductor length L, the conductor width, w, is increased with respect to other portions so as to decrease the current density for those regions or segments. For example, FIG. 4 is a schematic diagram of an interconnect structure 400 formed in accordance with an embodiment of the invention. As is shown, the structure 400 is modified (with respect to FIG. 3(a)) such that the width of the interconnect is w for the first half (0.50 L) segment and 2w for the second half (0.50 L) segment. Since the current density in the short width (w) segment is twice that in the long width (2w) segment, the critical length for the 2w segment is twice as high (2×) than for the w segment.

Figure 5:
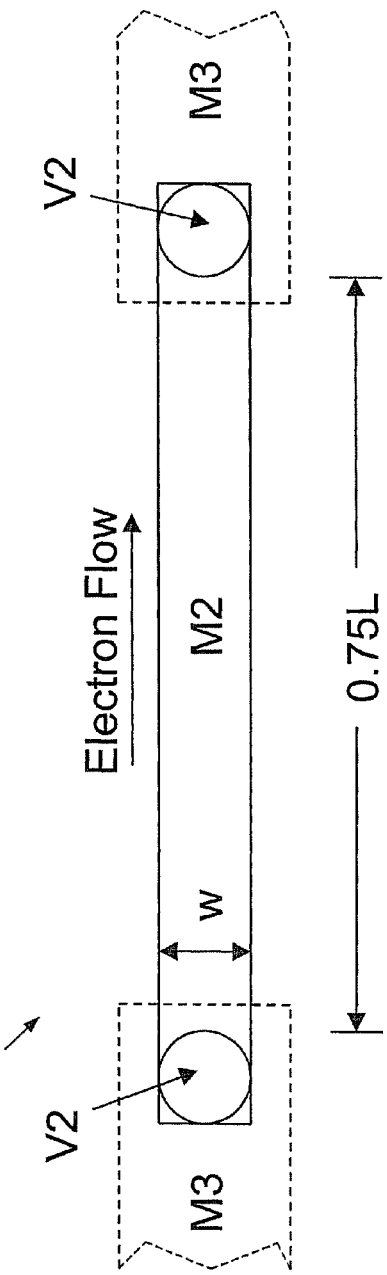
FIG. 5 is represents an equivalent interconnect structure with respect to FIG. 4, having a uniform narrow width, w, and a reduced length.

In terms of equivalent short-length benefits, FIG. 5 represents an equivalent interconnect structure 500 with respect to FIG. 4, having a uniform narrow width, w, but with a reduced length of 0.75 L. In other words, if the critical length for an interconnect with uniform width w is 0.75 L, then by widening portions of the interconnect as shown in FIG. 4, the segment length can be increased to L so as to produce the same short-length benefits as the shorter 0.75 L interconnect in FIG. 5.

Figure 6:
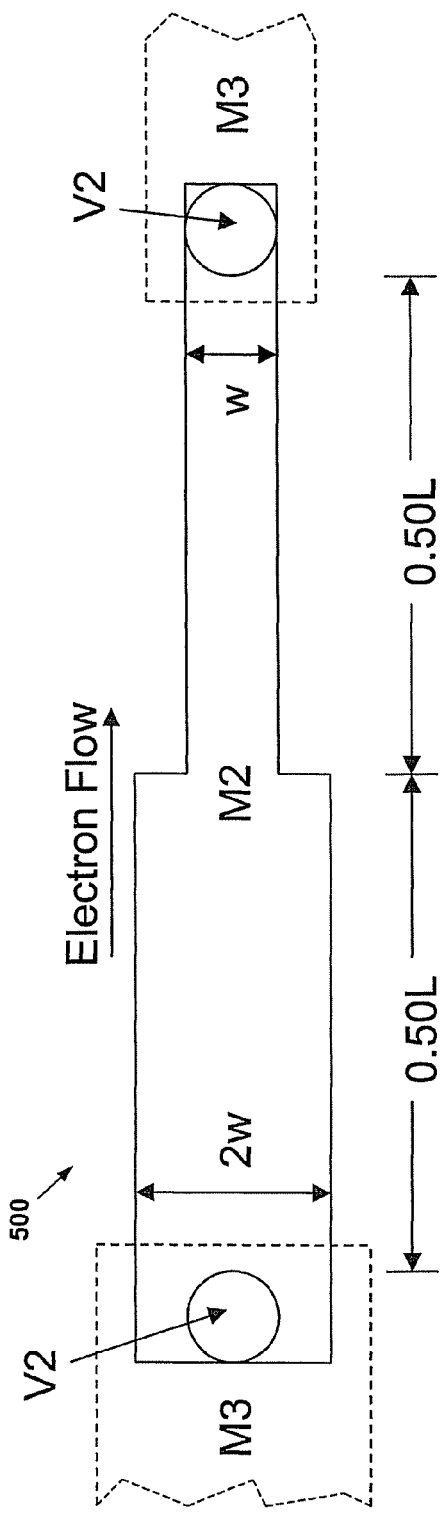
FIG. 6 is a schematic diagram of an interconnect structure having improved electromigration resistance characteristics, in accordance with an alternative embodiment of the invention.
Figure 7:
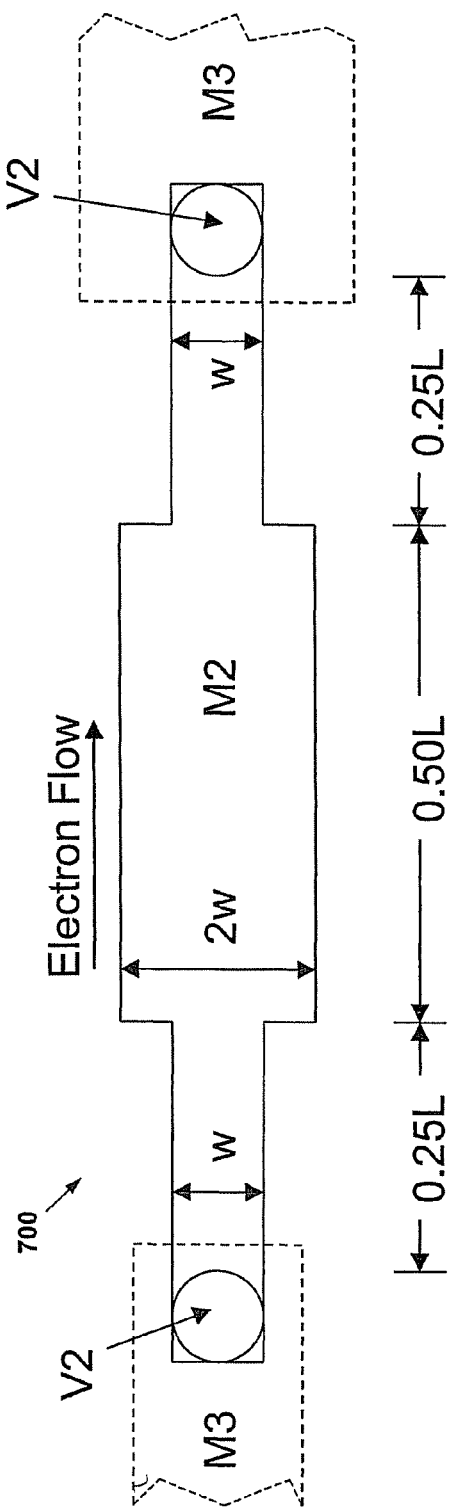
FIG. 7 is a schematic diagram of an interconnect structure having improved electromigration resistance characteristics, in accordance with another alternative embodiment of the invention.
Figure 8:
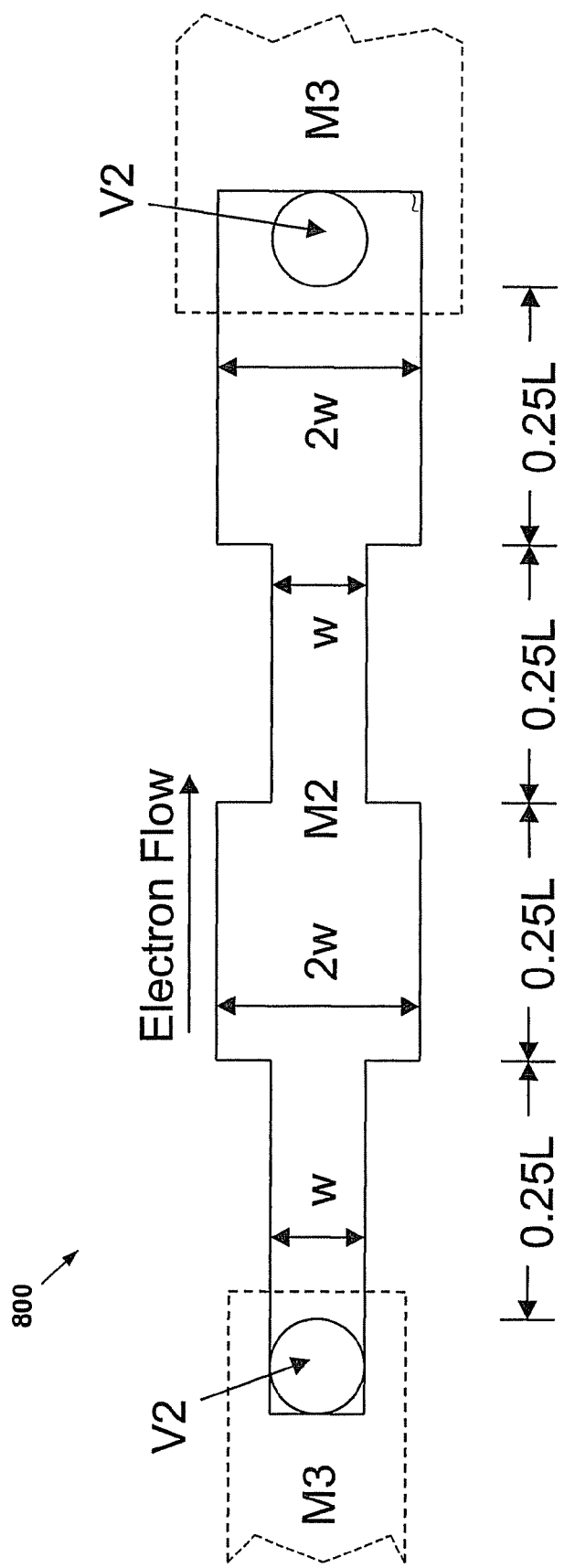
FIG. 8 is a schematic diagram of an interconnect structure having improved electromigration resistance characteristics, in accordance with another alternative embodiment of the invention.

In addition to the specific arrangement shown in FIG. 4 (i.e., the narrow half of the conductor is disposed at the cathode end of the structure and the wide half of the conductor is disposed at the anode end of the structure), other arrangements are also contemplated. For example, the wide (2w) portion could be located at the cathode end of the structure and the narrow (w) portion could be located at the anode end of the structure as shown in the interconnect structure 600 of FIG. 6. Alternatively, the wide (2w) portion could be roughly in the middle of the conductor, with a pair of 0.25 L narrow (w) portions at both the cathode and anode ends of the structure as shown in the interconnect structure 700 of FIG. 7. In still another variation, the conductor length could have alternating, multiple segments of w and 2w widths, as shown in the interconnect structure 800 of FIG. 8. In each instance of the embodiments of FIGS. 4, 6, 7, and 8, half of the total conductor length, L, is formed at width w, and half the total conductor length is formed at width 2w. In this manner, the length L need not be shortened so as to increase the amount of device vias in order to derive short-length benefits if the critical length for a uniform width conductor, w, happens to be less than the desired length, L.

It should be understood, however, that the liner thickness at the bottom of the V2 vias must be sufficient in order for the short-length effect to be used properly. If the M3 line contacting the V2 vias is too narrow, the aspect ratio of the structure increases and may prevent adequate liner coverage in the vias. That is, if the width of the M3 line is comparable to the size of the V2 via, the structure may show less short-length effects. Therefore, care should be taken to make sure the design is compatible with process limitations. Also, the short-length effect also exists in structures where the electron flow is from the via into the line above, referred to as the via depletion failure mode. The exemplary structures described above correspond to the situation where the electron flow is from the via into the line below, which is referred to as the line depletion failure mode.

It is possible to provide a methodology for determining how long the wide region(s) of an interconnect needs to be compared to the narrow region(s) in order to achieve a desired threshold condition. That is, if the layout shown in FIGS. 3(a) and 3(b) corresponds to the threshold short-length condition for a given current density, then structures having both narrow and wide segments may be designed that will result in the same reliability benefits without reducing the interconnect length itself and requiring additional vias. Considering, for example, a specific case in which the interconnect design can only have two widths, where (for example) $w_1=0.1$ μm is the width of the narrow segment(s), and where $w_2=0.2$ μm, $w_2=0.3$ μm, $w_2=0.4$ μm and $w_2=0.5$ μm are the possible widths of the wide segment(s). If $L_1$ represents the total length of the narrow region(s) and $L_2$ is the length of the wide region, then $L_1+L_2$ is the total length, L, of the interconnect structure. For a given current, if the critical length is 100 μm for 0.1 μm interconnect width, then the critical length is 200 μm for 0.2 μm width, 300 μm for 0.3 μm width, 400 μm for 0.4 μm width and 500 μm for 0.5 μm width. Therefore, the following relationships may be used to determine the corresponding lengths of the wide region(s) with respect to the narrow region(s):

| Width of Wide Region, $w_2$ (μm) | Maximum Length of Wide Region, $L_2$ (μm) |
|---|---|
| 0.2 | $2(100 - L_1)$ |
| 0.3 | $3(100 - L_1)$ |
| 0.4 | $4(100 - L_1)$ |
| 0.5 | $5(100 - L_1)$ |

It should be understood that $L_2$ corresponds to a maximum total length for the wide segment(s) that would result in the threshold condition.

Stated even more generally, if $L_C$ represents the critical length of an interconnect structure formed entirely of a first (narrow width) $w_1$ for a given current, then the relationship between the total length $L_1$ of the narrow region(s), the total length of the wide region(s) $L_2$ and the critical length is as follows:

$$L_1 + \left(\frac{w_1}{w_2}\right)L_2 \leq L_C; \quad (\text{Eq. 4})$$

and accordingly with respect to $L_2$ in terms of $L_1$:

$$L_2 \leq \left(\frac{w_2}{w_1}\right)(L_C - L_1). \quad (\text{Eq. 5})$$

Continuing with the above example, it is assumed that in forming a uniform interconnect structure at a narrow width $w_1$ of 0.1 μm for a given current, the total length of the structure may not exceed 100 μm in order to maintain short-length EM benefits. However, it is also assumed in this example the IC design requires an interconnect length of at least 150 μm in order to avoid adding more interlevel vias, which may otherwise decrease device yield and/or increase resistance. By forming a 150 μm long interconnect structure such that 50 μm of the total length is formed at $w_1$=0.1 μm and the remaining 100 μm of the total length is formed at $w_2$=0.2 μm, such an interconnect structure has equivalent short-length benefits as a 100 μm interconnect structure formed entirely at the narrow width $w_1$ of 0.1 μm. Still another equivalent 150 μm interconnect structure could be, for example, one where 75 μm of the total length is formed at $w_1$=0.1 μm, and the remaining 75 μm of the total length is formed at $w_2$=0.3 μm.

Figure 9:
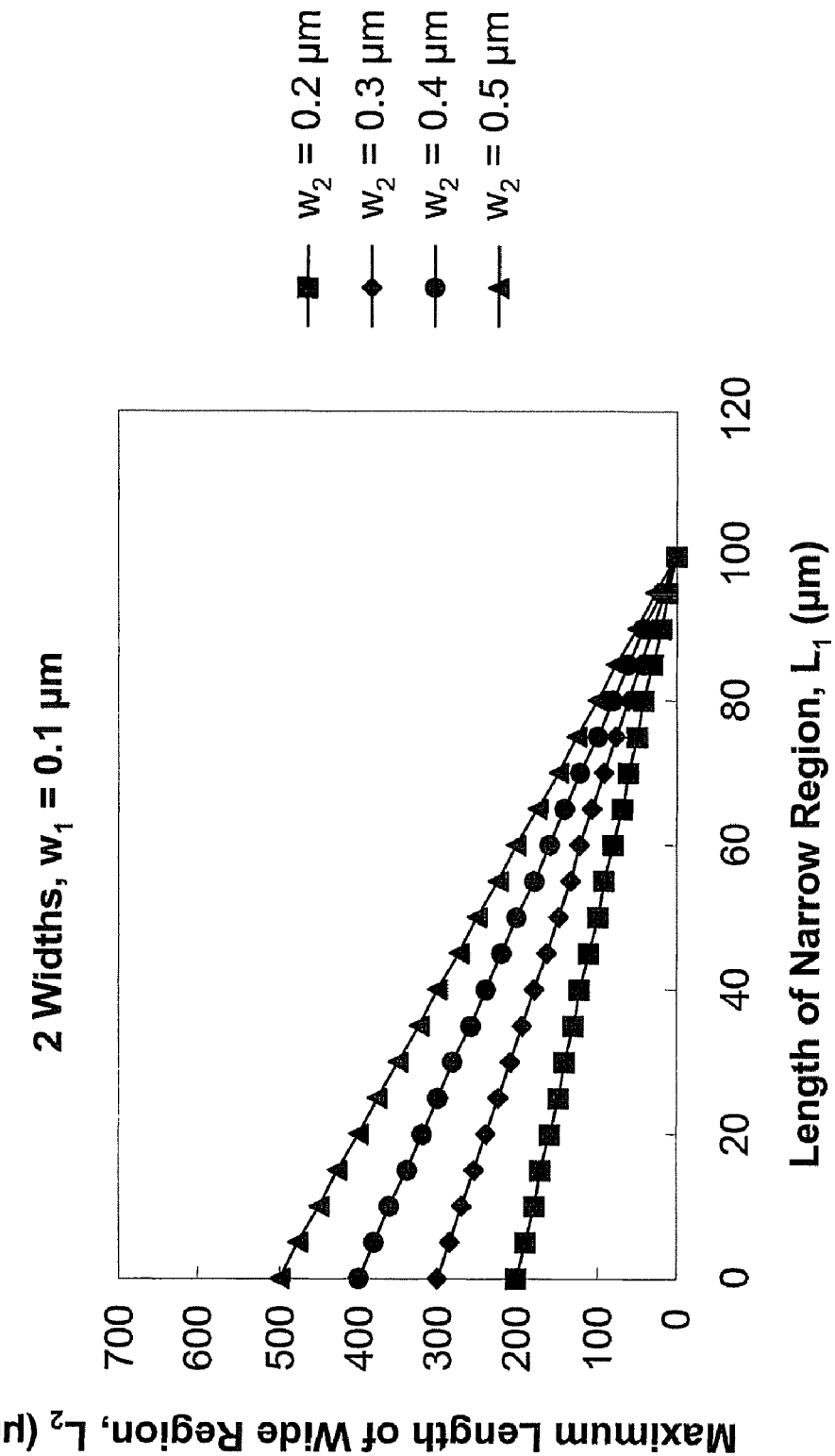
FIG. 9 is a graph depicting the relationship between a total length of the narrow region(s) of an interconnect structure versus the total length of the remaining wide region(s) needed to achieve an electromigration short-length benefit threshold condition, in accordance with a further embodiment of the invention.

FIG. 9 is a graph illustrating how the above relationships are applied to a structure with two allowable widths, narrow and wide. For a given total length of the narrow region(s), the total length of the wide region(s) needed to achieve the threshold condition increases as the width of the wide region increases. As can be seen, the total length of the interconnect can be significantly greater than 100 μm and still have the same reliability improvements. Each point on the linear curves shown in FIG. 9 corresponds to the same threshold condition, that of a 0.1 μm wide and 100 μm long interconnect.

It should be understood that a similar methodology may be developed if more than two widths are permitted in the design. That is, the above technique is extendable to interconnect structures with more than two widths; i.e., a first (narrowest) baseline width and a plurality of secondary widths that are each greater than the first width. For example, there may be a specific case in which the interconnect design can only have three widths, where (for example) $w_1$=0.1 μm is the width of the narrow segment(s), where $w_2$=0.2 μm, $w_2$=0.3 μm, $w_2$=0.4 μm and $w_2$=0.5 μm are the possible widths of one of the wide segment(s), and where $w_3$=0.2 μm, $w_3$=0.3 μm, $w_3$=0.4 μm and $w_3$=0.5 μm are the possible widths of the other of the wide segment(s). If $L_1$ represents the total length of the narrow region(s), $L_2$ is the length of one wide region and $L_3$ is the length of the other wide region, then $L_1+L_2+L_3$ is the total length, L, of the interconnect structure.

For a given current, if the critical length is 100 μm for 0.1 μm interconnect width, then the critical length is 200 μm for 0.2 μm width, 300 μm for 0.3 μm width, 400 μm for 0.4 μm width and 500 μm for 0.5 μm width. Therefore, the following relationships may be used to determine the corresponding lengths of one of the wide region(s), $w_2$, with respect to the narrow region(s) and the other wide region(s), $w_3$:

| Width of Wide Region, $w_2$ (μm) | Maximum Length of Wide Region, $L_2$ (μm) |
| --- | --- |
| 0.2 | $2(100 - L_1 - ((w_1/w_3)L_3))$ |
| 0.3 | $3(100 - L_1 - ((w_1/w_3)L_3))$ |
| 0.4 | $4(100 - L_1 - ((w_1/w_3)L_3))$ |
| 0.5 | $5(100 - L_1 - ((w_1/w_3)L_3))$ |

It should be understood that $L_2$ corresponds to a maximum total length for the wide segment(s) that would result in the threshold condition.

Stated even more generally, if $L_C$ represents the critical length of an interconnect structure formed entirely a first (narrow width) $w_1$ for a given current, then the relationship between the total length $L_1$ of the narrow region(s), the total lengths of the wide region(s) $L_2$, $L_3$, and the critical length is as follows:

$$L_1 + \left(\frac{w_1}{w_2}\right)L_2 + \left(\frac{w_1}{w_3}\right)L_3 \leq L_C; \quad \text{(Eq. 6)}$$

and accordingly with respect to $L_2$ in terms of $L_1$ and $L_3$:

$$L_2 \leq \left(\frac{w_2}{w_1}\right)\left(L_C - L_1 - \left(\frac{w_1}{w_3}\right)L_3\right). \quad \text{(Eq. 7)}$$

By the same token, the following relationships may be used to determine the corresponding lengths of the other of the wide region(s), $w_3$, with respect to the narrow region(s) and the one wide region(s), $w_2$:

| Width of Wide Region, $w_3$ (μm) | Maximum Length of Wide Region, $L_3$ (μm) |
| --- | --- |
| 0.2 | $2(100 - L_1 - ((w_1/w_2)L_2))$ |
| 0.3 | $3(100 - L_1 - ((w_1/w_2)L_2))$ |
| 0.4 | $4(100 - L_1 - ((w_1/w_2)L_2))$ |
| 0.5 | $5(100 - L_1 - ((w_1/w_2)L_2))$ |

It should be understood that $L_3$ corresponds to a maximum total length for the wide segment(s) that would result in the threshold condition.

As stated above, if $L_C$ represents the critical length of an interconnect structure formed entirely of a first (narrow width) $w_1$ for a given current, then the relationship between the total length $L_1$ of the narrow region(s), the total lengths of the wide region(s) $L_2$, $L_3$, and the critical length is as follows:

$$L_1 + \left(\frac{w_1}{w_2}\right)L_2 + \left(\frac{w_1}{w_3}\right)L_3 \leq L_C; \quad \text{(Eq. 8)}$$

and accordingly with respect to $L_3$ in terms of $L_1$ and $L_2$:

$$L_3 \leq \left(\frac{w_3}{w_1}\right)\left(L_C - L_1 - \left(\frac{w_1}{w_2}\right)L_2\right). \quad \text{(Eq. 9)}$$

Figure 10:
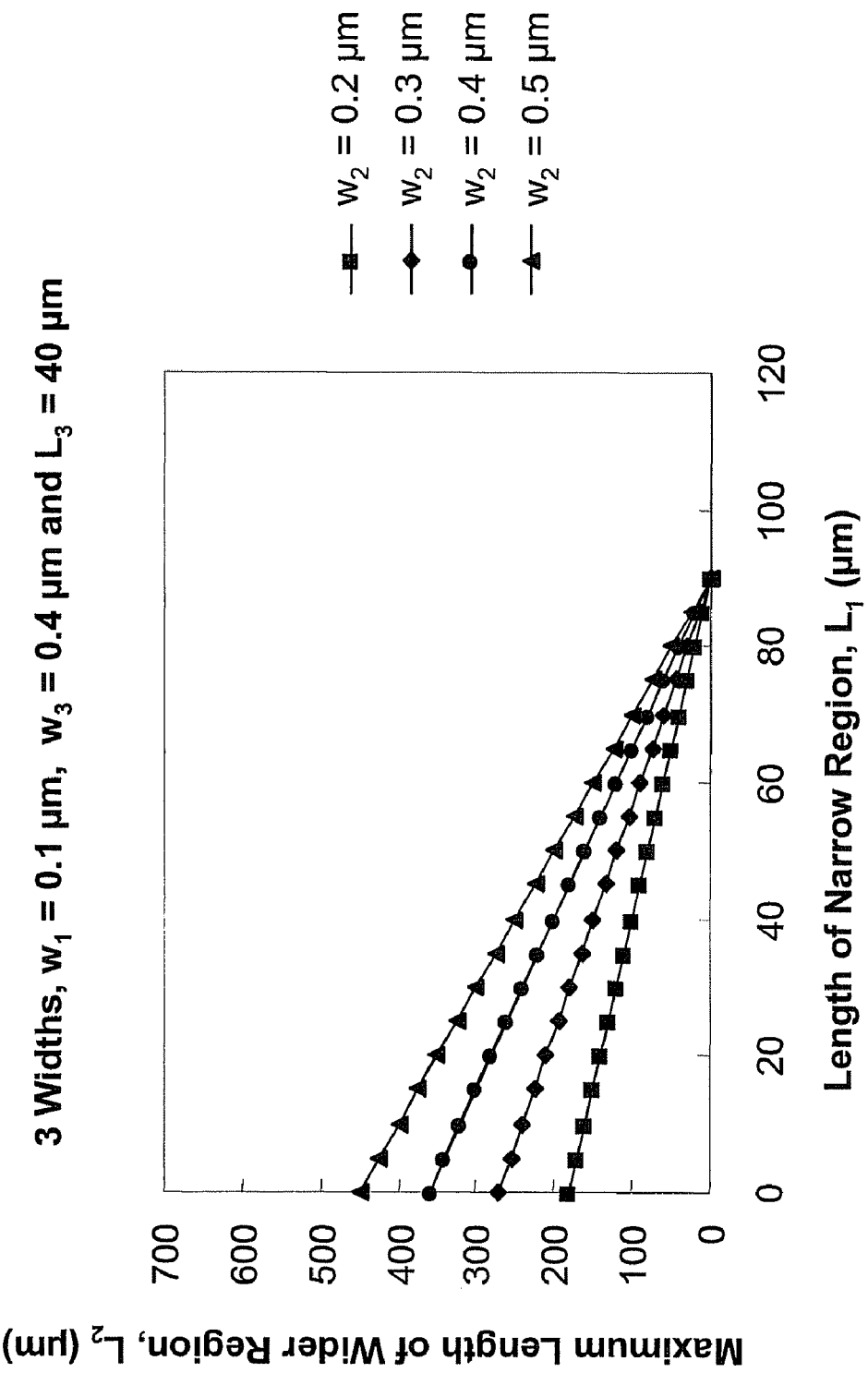
FIG. 10 is a graph illustrative of an additional embodiment of structure having three allowable design widths.
Figure 11:
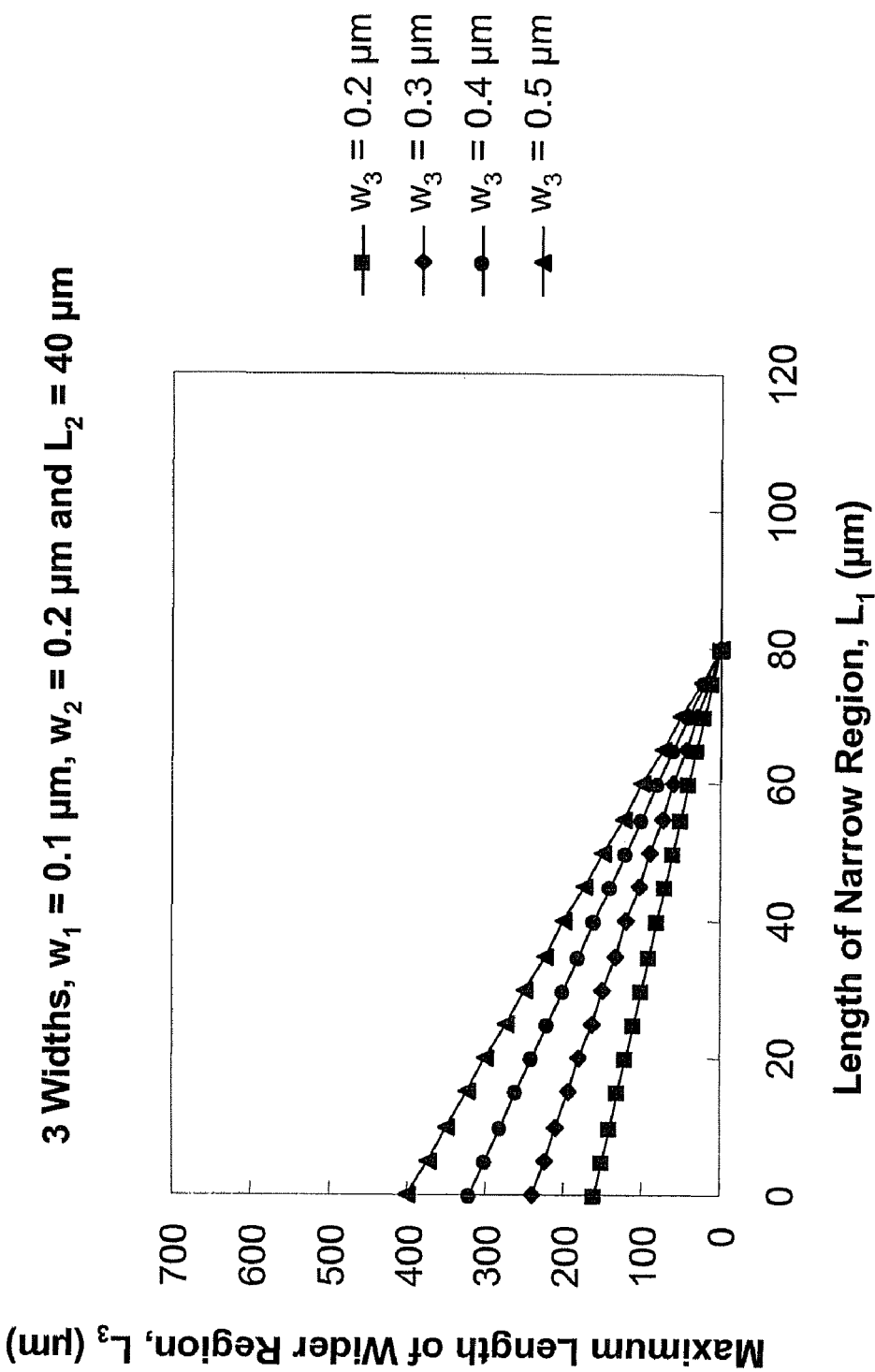
FIG. 11 is another graph illustrative of an additional embodiment of structure having three allowable design widths.

Referring to FIGS. 10 and 11, there is shown a pair of graphs illustrating how the above relationships are extendable to a structure with three allowable design widths, a baseline narrowest width ($w_1$) and additional widths $w_2$ and $w_3$ that are both greater than $w_1$. In the example of FIG. 10, the narrow width $w_1$ is again 0.1 μm, with the third width $w_3$ being 0.4 μm, and at a total segment length, $L_3$, at $w_3$ being 40 μm. FIG. 10 thus illustrates the relationship between the total length, $L_1$ of one or more segments at $w_1$=0.1 μm to the total length, $L_2$, of one or more segments at a width, $w_2$, for a plurality of values of $w_2$. It is noted that the second width, $w_2$, could be greater than or less than the third width, $w_3$, but both $w_2$ and $w_3$ are greater than $w_1$.

FIG. 11 illustrates a similar example with respect to a three-width structure as presented in FIG. 10. Here, the narrow width $w_1$ is again 0.1 μm, with the second width $w_2$ being 0.2 μm, and at a total segment length, $L_2$, at $w_2$ being 40 μm. FIG. 11 illustrates the relationship between the total length, $L_1$ of one or more segments at $w_1$=0.1 μm to the total length, $L_3$, of one or more segments at a width, $w_3$, for a plurality of values of $w_3$.

Regardless of the number of additional (wider) widths used beyond the narrowest baseline width, it will be seen that for a given total length of the narrow region(s), the total length of the wide region(s) needed to achieve the threshold condition increases as the width of the wide region increases. A general expression for any number of widths in the structure is as follows:

$$\sum_{i=1}^{N} \left(\frac{w_1}{w_i}\right) L_i \le L_C. \quad \text{(Eq. 10)}$$

Furthermore, a general expression for the total segment length, $L_M$, in terms of the other segments (for $i \ne M$) is as follows:

$$L_M \le \frac{w_M}{w_1} \left( L_C - \sum_{i=1}^{N} \left(\frac{w_1}{w_i}\right)(L_i) \right); \quad \text{(Eq. 11)}$$

wherein N is the number of different widths in the structure, $L_M$ is the length of the $M^{th}$ segment and $L_C$ is the critical length for the narrow segment.

By way of a further example, if an interconnect structure has four permissible design widths (i.e., N=4), where $L_C$=100 μm, $w_1$=0.1 μm, $L_1$=25 μm, $w_2$=0.2 μm, $L_2$=50 μm, $w_3$=0.3 μm, $L_3$=75 μm, $w_4$=0.4 μm, then from Eq. 11 above, $L_4$=100 μm, and the total length, L, of the structure is: L=$L_1$+$L_2$+$L_3$+$L_4$=25 μm+50 μm+75 μm+100 μm=250 μm.

As also indicated above, there are practical considerations with respect to short-length effects in wide lines, in that the $(jL)_{th}$ is known to be lower for wide lines as compared to narrow lines. The effect of width on the electromigration threshold has been observed in AlCu interconnects with an $SiO_2$ dielectric and was attributed to an effective bulk modulus that depends on the elastic properties of the metallization and the surrounding dielectric material. The model used to explain this behavior is also based on the idea that the stresses in the metallization relax during electromigration testing. It was found that the relaxed bulk modulus depends on the width and thickness of the lines, decreasing as the width increases for a given thickness of metal. As a result, the electromigration threshold decreases as the line width increases. The same behavior is expected to occur in Cu interconnects and low-k dielectric materials. Additional information in this regard may be found in R. G. Filippi, et al., "The Effect of Current Density, Stripe Length, Stripe Width, and Temperature on Resistance Saturation During Electromigration Testing", Journal of Applied Physics, Volume 91, No. 9, May 1, 2002, the contents of which are incorporated by reference herein in their entirety.

Although this is a secondary effect, it is desirable to determine the dependence of $(jL)_{th}$ on width for a proper implementation of the interconnect design. Thus, in order to account for the reduction in $(jL)_{th}$ with increasing width, correction terms are needed that are dependent on both the width, w, and the thickness, t, of the lines. The ratio of the $(jL)_{th}$ for a line showing width effects to the maximum possible $(jL)_{th}$ is the correction term for each width. If $L_{max}$ represents the maximum critical length and $L_{th}$ is the actual critical length for a segment showing width effects, then A(w,t)=$L_{th}/L_{max}$ is the correction term that accounts for these width effects. The maximum critical length would correspond to the case of w/t=1, where the width and thickness of the lines are the same. A general expression for any number of widths in an interconnect structure, accounting for width effects, is given as follows:

$$\sum_{i=1}^{N} \left(\frac{w_1}{w_i}\right)\left(\frac{A_1(w_1, t_1)}{A_i(w_i, t_i)}\right) L_i \le L_C; \quad \text{(Eq. 12)}$$

and in terms of $L_M$ with respect to the other segments (for $i \ne M$):

$$L_M \le \left(\frac{w_M}{w_1}\right)\left(\frac{A_M(w_M, t_M)}{A_1(w_1, t_1)}\right)\left(L_C - \sum_{i=1}^{N} \left(\frac{w_1}{w_i}\right)\left(\frac{A_1(w_1, t_1)}{A_i(w_i, t_i)}\right) L_i\right); \quad \text{(Eq. 13)}$$

wherein N is the number of different widths in the structure, $L_M$ is the length of the $M^{th}$ segment, $L_C$ is the critical length for the narrow segment, $A_1(w_1,t_1)$ is the correction term for the narrow segment, $A_i(w_i,t_i)$ is the correction term for the $i^{th}$ width, and $A_M(w_M,t_M)$ is the correction term for the $M^{th}$ width.

Returning again to the above described four-width interconnect structure, the following exemplary values reflect a dependence of $(jL)_{th}$ on width: N=4, $L_C$=100 μm, $A_1(w_1,t_1)$=1, $w_1$=0.1 μm, $L_1$=25 μm, $A_2(w_2,t_2)$=0.9, $w_{2=0.2}$ μm, $L_2$=50 μm, $A_3(w_3,t_3)$=0.8, $w_3$=0.3 μm, $L_3$=75 μm, $A_4(w_4,t_4)$=0.7, $w_4$=0.4 μm, then from Eq. 13 above $L_4$=44.7 μm. Accordingly, the total length, L, of the structure considering correction for width effects is: L=$L_1$+$L_2$+$L_3$+$L_4$=25 μm+50 μm+75 μm+44.7 μm=194.7 μm. In practical terms, this means that the allowed length is reduced from 250 μm to 194.7 μm if width effects are considered. Notably, this is still much longer than 100 μm, which would be the allowed length if only a narrow 0.1 μm wide segment is used in the design.

In summary, an alternate way of obtaining electromigration short-length effects has been disclosed herein. Instead of reducing the distance between vias to reach the threshold condition, the present approach varies the interconnect width such that the desired threshold condition is obtained for longer interconnect lengths. This allows for numerous design opportunities in which short-length benefits are required.

Although the exemplary embodiments described herein describe that an "electromigration short-length effect benefit" corresponds to a length at which an electromigration force applied in one direction of the conductive line is balanced by a back-flow force applied in the opposite direction of the conductive line so as to suppress mass transport of atoms of the conductive line (i.e., the prevention of electromigration damage), it is also contemplated the critical thresholds herein can also closely be approached or approximated such that some measure of electromigration would still be permissible, over an extended period of time. In this sense, an "electromigration short-length effect benefit" would be derived not necessarily by completely eliminating electromigration altogether, but by making an interconnect structure more electromigration resistant by widening certain sections along the length thereof while maintaining a desired minimum distance between vertical via connections.

It should also be understood that while existing semiconductor wiring methods utilize copper and/or aluminum containing conductive materials and alloys thereof, other materials are also contemplated within the scope of the present embodiments including, but limited to, for example, gold, silver and alloys thereof. In addition, it is contemplated that the Dual Damascene Cu examples shown in FIGS. 2(a) and 2(b) (in which via and lines are formed in the same step) are also applicable to single Damascene processes, in which vias and lines are formed in separate steps.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An interconnect structure for an integrated circuit (IC) device, the structure comprising:
    an elongated, electrically conductive line comprising one or more segments formed at a first width, $w_1$, and one or more segments formed at one or more additional widths, $w_2 \ldots w_N$, with the first width being narrower than each of the one or more additional widths;
    wherein the relationship of the total length, $L_1$, of the one or more conductive segments formed at the first width to the total lengths, $L_2 \ldots L_N$, of the one or more conductive segments formed at the one or more additional widths is selected such that, for a given magnitude of current carried by the conductive line, a critical length with respect to an electromigration short-length effect benefit is maintained such that a total length of the conductive line, $L=L_1+L_2+ \ldots +L_N$, meets a minimum desired design length regardless of the critical length;
    wherein $L_C$ represents the critical length of an equivalent interconnect structure formed entirely at the first width $w_1$ for the given magnitude of current, and wherein the relationship between the total length $L_1$ of the one or more segments formed at the first width, the total lengths, $L_2 \ldots L_N$, of the one or more segments formed at the one or more additional widths and $L_C$ is given as follows:

$$\sum_{i=1}^{N} \left(\frac{w_1}{w_i}\right) L_i \le L_C;$$

wherein N is the number of different widths in the structure; and
    wherein the total length of the conductive line, L, is selected so as to compensate for width effects in which a threshold length product, $(jL)_{th}$, reduces with increasing width, with j representing current density, such that a correction term $A(w,t)=L_{th}/L_{max}$ is a correction term that accounts for the width effects, the correction term dependent on the width, w, and a thickness, t, of a given segment, wherein $L_{max}$ represents a maximum critical length and $L_{th}$ is the actual critical length for a segment showing width effects, and wherein the relationship between the total length $L_1$ of the one or more segments formed at the first width, the total lengths, $L_2 \ldots L_N$, of the one or more segments formed at the one or more additional widths and $L_C$ is given as follows:

$$\sum_{i=1}^{N} \left(\frac{w_1}{w_i}\right)\left(\frac{A_1(w_1, t_1)}{A_i(w_i, t_i)}\right) L_i \le L_C.$$

2. The interconnect structure of claim 1, wherein the critical length with respect to the electromigration short-length effect benefit corresponds to a length at which an electromigration force applied in one direction of the conductive line is balanced by a back-flow force applied in the opposite direction of the conductive line so as to suppress mass transport of atoms of the conductive line.

3. The interconnect structure of claim 1, wherein the conductive line comprises a single segment formed at the first width, $w_1$, that is located at one of an anode end and a cathode end thereof, and a single segment formed at a second width, $w_2$, that is located at the other of the anode end and the cathode end thereof.

4. The interconnect structure of claim 1, wherein the conductive line comprises a pair of segments formed at the first width, $w_1$, one of which is located at an anode end thereof, and the other of which is located at a cathode end thereof, and a single segment formed at a second width, $w_2$, that is located at a middle portion thereof, between the anode and cathode ends.

5. An interconnect structure for an integrated circuit (IC) device, the structure comprising:
    an elongated, electrically conductive line comprising one or more layers of a refractory metal and nitrides thereof, and at least one of a copper containing material and an aluminum containing material, the electrically conductive line in electrical contact with a pair of diffusion barriers located at opposite ends of the conductive line;
    the elongated conductive line further comprising one or more segments formed at a first width, $w_1$, and one or more segments formed at one or more additional widths, $w_2 \ldots w_N$, with the first width being narrower than each of the one or more additional widths;
    wherein the relationship of the total length, $L_1$, of the one or more conductive segments formed at the first width to the total lengths, $L_2 \ldots L_N$, of the one or more conductive segments formed at the one or more additional widths is selected such that, for a given magnitude of current carried by the conductive line, a critical length with respect to an electromigration short-length effect benefit is maintained such that a total length of the conductive line, $L=L_1+L_2+ \ldots +L_N$, meets a minimum desired design length regardless of the critical length;
    wherein $L_C$ represents the critical length of an equivalent interconnect structure formed entirely at the first width $w_1$ for the given magnitude of current, and wherein the relationship between the total length $L_1$ of the one or more segments formed at the first width, the total lengths, $L_2 \ldots L_N$, of the one or more segments formed at the one or more additional widths and $L_C$ is given as follows:

$$\sum_{i=1}^{N} \left(\frac{w_1}{w_i}\right) L_i \le L_C;$$

wherein N is the number of different widths in the structure; and
    wherein the total length of the conductive line, L, is selected so as to compensate for width effects in which a threshold length product, $(jL)_{th}$, reduces with increasing width, with j representing current density, such that a correction term $A(w,t)=L_{th}/L_{max}$ is a correction term that accounts for the width effects, the correction term dependent on the width, w, and a thickness, t, of a given segment, wherein $L_{max}$ represents a maximum critical length and $L_{th}$ is the actual critical length for a segment showing width effects, and wherein the relationship between the total length $L_1$ of the one or more segments formed at the first width, the total lengths, $L_2 \ldots L_N$, of the one or more segments formed at the one or more additional widths and $L_C$ is given as follows:

$$\sum_{i=1}^{N} \left(\frac{w_1}{w_i}\right)\left(\frac{A_1(w_1, t_1)}{A_i(w_i, t_i)}\right) L_i \le L_C.$$

6. The interconnect structure of claim 5, wherein the critical length with respect to the electromigration short-length effect benefit corresponds to a length at which an electromigration force applied in one direction of the conductive line is balanced by a back-flow force applied in the opposite direction of the conductive line so as to suppress mass transport of atoms of the conductive line.

7. The interconnect structure of claim 5, wherein the conductive line comprises a single segment formed at the first width, $w_1$, that is located at one of an anode end and a cathode end thereof, and a single segment formed at a second width, $w_2$, that is located at the other of the anode end and the cathode end thereof.

8. The interconnect structure of claim 5, wherein the conductive line comprises a pair of segments formed at the first width, $w_1$, one of which is located at an anode end thereof, and the other of which is located at a cathode end thereof, and a single segment formed at a second width, $w_2$, that is located at a middle portion thereof, between the anode and cathode ends.

9. The interconnect structure of claim 5, wherein the refractory metal and nitrides thereof is selected from the group of: tantalum (Ta), tantalum nitride (TaN), titanium (Ti), titanium nitride (TiN), tungsten (W), tungsten nitride (WN), ruthenium (Ru), and ruthenium nitride (RuN).

10. A method of forming an interconnect structure for an integrated circuit (IC) device, the method comprising:
forming an elongated, electrically conductive line comprising one or more segments formed at a first width, $w_1$, and one or more segments formed at one or more additional widths, $w_2 \ldots w_N$, with the first width being narrower than each of the one or more additional widths;
wherein the relationship of the total length, $L_1$, of the one or more conductive segments formed at the first width to the total lengths, $L_2 \ldots L_N$, of the one or more conductive segments formed at the one or more additional widths is selected such that, for a given magnitude of current carried by the conductive line, a critical length with respect to an electromigration short-length effect benefit is maintained such that a total length of the conductive line, $L=L_1+L_2+ \ldots +L_N$, meets a minimum desired design length regardless of the critical length;
wherein $L_C$ represents the critical length of an equivalent interconnect structure formed entirely at the first width $w_1$ for the given magnitude of current, and wherein the relationship between the total length $L_1$ of the one or more segments formed at the first width, the total lengths, $L_2 \ldots L_N$, of the one or more segments formed at the one or more additional widths and $L_C$ is given as follows:

$$\sum_{i=1}^{N} \left(\frac{w_1}{w_i}\right) L_i \le L_C;$$

wherein N is the number of different widths in the structure; and
wherein the total length of the conductive line, L, is selected so as to compensate for width effects in which a threshold length product, $(jL)_{th}$, reduces with increasing width, with j representing current density, such that a correction term $A(w,t)=L_{th}/L_{max}$ is a correction term that accounts for the width effects, the correction term dependent on the width, w, and a thickness, t, of a given segment, wherein $L_{max}$ represents a maximum critical length and $L_{th}$ is the actual critical length for a segment showing width effects, and wherein the relationship between the total length $L_1$ of the one or more segments formed at the first width, the total lengths, $L_2 \ldots L_N$, of the one or more segments formed at the one or more additional widths and $L_C$ is given as follows:

$$\sum_{i=1}^{N} \left(\frac{w_1}{w_i}\right)\left(\frac{A_1(w_1, t_1)}{A_i(w_i, t_i)}\right) L_i \le L_C.$$

11. The method of claim 10, wherein the critical length with respect to the electromigration short-length effect benefit corresponds to a length at which an electromigration force applied in one direction of the conductive line is balanced by a back-flow force applied in the opposite direction of the conductive line so as to suppress mass transport of atoms of the conductive line.

12. The method of claim 10, wherein the conductive line comprises a single segment formed at the first width, $w_1$, that is located at one of an anode end and a cathode end thereof, and a single segment formed at a second width, $w_2$, that is located at the other of the anode end and the cathode end thereof.

13. The method of claim 10, wherein the conductive line comprises a pair of segments formed at the first width, $w_1$, one of which is located at an anode end thereof, and the other of which is located at a cathode end thereof, and a single segment formed at a second width, $w_2$, that is located at a middle portion thereof, between the anode and cathode ends.

14. A method of forming an interconnect structure for an integrated circuit (IC) device, the method comprising:
forming an elongated, electrically conductive line comprising one or more layers of a refractory metal and nitrides thereof, and at least one of a copper containing material and an aluminum containing material, the electrically conductive line in electrical contact with a pair of diffusion barriers located at opposite ends of the conductive line;
the elongated conductive line further comprising one or more segments formed at a first width, $w_1$, and one or more segments formed at one or more additional widths, $w_2 \ldots w_N$, with the first width being narrower than each of the one or more additional widths;
wherein the relationship of the total length, $L_1$, of the one or more conductive segments formed at the first width to the total lengths, $L_2 \ldots L_N$, of the one or more conductive segments formed at the one or more additional widths is selected such that, for a given magnitude of current carried by the conductive line, a critical length with respect to an electromigration short-length effect benefit is maintained such that a total length of the conductive line, $L=L_1+L_2+ \ldots +L_N$, meets a minimum desired design length regardless of the critical length;

wherein $L_C$ represents the critical length of an equivalent interconnect structure formed entirely at the first width $w_1$ for the given magnitude of current, and wherein the relationship between the total length $L_1$ of the one or more segments formed at the first width, the total lengths, $L_2 \ldots L_N$, of the one or more segments formed at the one or more additional widths and $L_C$ is given as follows:

$$\sum_{i=1}^{N} \left(\frac{w_1}{w_i}\right) L_i \le L_C;$$

wherein N is the number of different widths in the structure; and wherein the total length of the conductive line, L, is selected so as to compensate for width effects in which a threshold length product, $(jL)_{th}$, reduces with increasing width, with j representing current density, such that a correction term $A(w,t)=L_{th}/L_{max}$ is a correction term that accounts for the width effects, the correction term dependent on the width, w, and a thickness, t, of a given segment, wherein $L_{max}$ represents a maximum critical length and $L_{th}$ is the actual critical length for a segment showing width effects, and wherein the relationship between the total length $L_1$ of the one or more segments formed at the first width, the total lengths, $L_2 \ldots L_N$, of the one or more segments formed at the one or more additional widths and $L_C$ is given as follows:

$$\sum_{i=1}^{N} \left(\frac{w_1}{w_i}\right)\left(\frac{A_1(w_1, t_1)}{A_i(w_i, t_i)}\right) L_i \le L_C.$$

15. The method of claim 14, wherein the critical length with respect to the electromigration short-length effect benefit corresponds to a length at which an electromigration force applied in one direction of the conductive line is balanced by a back-flow force applied in the opposite direction of the conductive line so as to suppress mass transport of atoms of the conductive line.

16. The method of claim 14, wherein the conductive line comprises a single segment formed at the first width, $w_1$, that is located at one of an anode end and a cathode end thereof, and a single segment formed at a second width, $w_2$, that is located at the other of the anode end and the cathode end thereof.

17. The method of claim 14, wherein the refractory metal and nitrides thereof is selected from the group of tantalum (Ta), tantalum nitride (TaN), titanium (Ti), titanium nitride (TiN), tungsten (W), tungsten nitride (WN), ruthenium (Ru), and ruthenium nitride (RuN).

* * * * *